(12) United States Patent
Stephens et al.

(10) Patent No.: US 8,856,715 B1
(45) Date of Patent: Oct. 7, 2014

(54) CAPACITOR DESIGNS FOR INTEGRATED CIRCUITS UTILIZING SELF-ALIGNED DOUBLE PATTERNING (SADP)

(71) Applicant: GlobalFoundries Inc., Grand Cayman (KY)

(72) Inventors: Jason Stephens, Cohoes, NY (US); Vikrant Chauhan, Ossining, NY (US); Lawrence Clevenger, LaGrangeville, NY (US); Ning Lu, Essex Junction, VT (US); Albert Chu, Nashua, NH (US)

(73) Assignee: GlobalFoundries Inc., Grand Cayman (KY)

( * ) Notice: Subject to any disclaimer, the term of this patent is extended or adjusted under 35 U.S.C. 154(b) by 0 days.

(21) Appl. No.: 13/948,249

(22) Filed: Jul. 23, 2013

(51) Int. Cl.
*G06F 17/50* (2006.01)
(52) U.S. Cl.
CPC .................................. *G06F 17/5072* (2013.01)
USPC ............ 716/122; 716/100; 716/118; 716/119
(58) Field of Classification Search
USPC .................................. 716/100, 118, 119, 122
See application file for complete search history.

(56) References Cited

U.S. PATENT DOCUMENTS

| | | | | |
|---|---|---|---|---|
| 5,245,750 | A * | 9/1993 | Crumly et al. | 29/840 |
| 6,166,333 | A * | 12/2000 | Crumly et al. | 174/255 |
| 6,880,134 | B2 * | 4/2005 | Drennan | 716/115 |
| 7,305,643 | B2 * | 12/2007 | McClellan et al. | 716/112 |
| 7,689,961 | B2 * | 3/2010 | Braun et al. | 716/115 |
| 8,255,858 | B2 * | 8/2012 | Huang et al. | 716/132 |
| 8,418,120 | B2 * | 4/2013 | Lu | 716/132 |
| 8,435,884 | B2 * | 5/2013 | Kim et al. | 438/637 |
| 8,458,642 | B2 * | 6/2013 | Lu | 716/136 |
| 8,601,430 | B1 * | 12/2013 | Shroff et al. | 716/137 |
| 8,627,258 | B2 * | 1/2014 | Huang et al. | 716/132 |
| 8,627,259 | B2 * | 1/2014 | Huang et al. | 716/132 |
| 2006/0088772 | A1 * | 4/2006 | Zhang | 430/5 |
| 2011/0061031 | A1 * | 3/2011 | Hsu et al. | 716/51 |
| 2012/0254820 | A1 * | 10/2012 | Lu | 716/136 |

* cited by examiner

*Primary Examiner* — Sun Lin
(74) *Attorney, Agent, or Firm* — Ditthavong & Steiner, P.C.

(57) ABSTRACT

Methodologies enabling BEoL VNCAPs in ICs and resulting devices are disclosed. Embodiments include: providing a plurality of mandrel recesses extending horizontally on a substrate, each of the mandrel recesses having an identical width and being separated from another one of the mandrel recesses by an identical distance; providing a plurality of routes, each of the plurality of routes being positioned in a different one of the mandrel recesses; and providing first and second vertical segments on the substrate, the first vertical segment being connected to a set of the plurality of routes and separated from the second vertical segment, and the second vertical segment being separated from the set of routes.

20 Claims, 15 Drawing Sheets

300

400

900

1000

1000

1000

1400

1600

1700

1900

US 8,856,715 B1

CAPACITOR DESIGNS FOR INTEGRATED CIRCUITS UTILIZING SELF-ALIGNED DOUBLE PATTERNING (SADP)

TECHNICAL FIELD

The present disclosure relates to manufacture of semiconductor devices. The present disclosure is particularly applicable for integrating back-end of line (BEoL) vertical natural capacitors (VNCAPs) into integrated circuits (ICs) utilizing SADP technology.

BACKGROUND

In fabrication of semiconductor devices, BEoL VNCAPs frequently offer higher capacitance density and lower cost over other technologies such as metal-insulator-metal (MIM) planar capacitors. Initially, traditional BEoL VNCAP designs utilized litho-etch (LE) processes for a 45 to 90 nanometer (nm) technology node. Next, traditional BEoL VNCAP designs utilized litho-etch-litho-etch (LELE) processes for a 45-28 nm technology node. However, to allow for even smaller technology nodes, traditional litho-etch-litho-etch-litho-etch (LELELE) processes may increase cost and manufacturing risk while reducing a yield of resulting devices, particularly for a 10 nm technology node and beyond.

A need therefore exists for a methodology enabling incorporation of BEoL VNCAPs in ICs, particularly, for the 10 nm technology node and beyond, and a resulting device.

SUMMARY

An aspect of the present disclosure is a method of enabling integration of capacitor components in an IC by, inter alia, providing a set of routes (e.g., patterns) in mandrel recesses connected to a first vertical segment (e.g., strap) and separated from a second vertical segment (e.g., strap).

Another aspect of the present disclosure is a device having, inter alia, a plurality of third routes (e.g., floating fingers) separated from first and second nets, each of the third routes extending horizontally on one of equally spaced vertical positions and separating one route of a first net from one route of a second net (e.g., interdigitated).

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing a plurality of mandrel recesses extending horizontally on a substrate, each of the mandrel recesses having an identical width and being separated from another one of the mandrel recesses by an identical distance; providing a plurality of routes, each of the plurality of routes being positioned in a different one of the mandrel recesses; and providing first and second vertical segments on the substrate, the first vertical segment being connected to a set of the plurality of routes and separated from the second vertical segment, and the second vertical segment being separated from the set of routes.

Aspects include providing a plurality of second routes in a plurality of non-mandrel recesses extending horizontally on the substrate and separated from the first vertical segment, each of the non-mandrel recesses being positioned on a midpoint between two adjacent mandrel recesses of the mandrel recesses and having the identical width. Additional aspects include: providing the second routes abutting the second vertical segment and separated from the first set of routes; and providing the second vertical segment in a non-mandrel region. Some aspects include: providing a mandrel region partially surrounding the second vertical segment; providing a block mask over the mandrel region, the block mask being separated from the second vertical segment; and etching, after providing the block mask, the block mask preventing etching of a covered portion of the mandrel region. Further aspects include: providing the second vertical segment in a mandrel region and abutting a second set of the first routes, each route of the second set being separated from a route of the first set by one route of the second routes; and providing the second routes separated from the second vertical segment. Additional aspects include: providing a mandrel region including first and second vertical portions overlapping the first and second vertical segments, respectively, and a plurality of horizontal portions overlapping the mandrel recesses, each of the horizontal portions abutting the first and second vertical segments, having a width equal to the identical width, and being separated from another one of the horizontal portions the identical distance; providing a block mask including a plurality of alternating third and fourth vertical portions on the horizontal portions, the third and fourth vertical portions abutting the second and first vertical segments, respectively; and etching, after providing the block mask, the block mask preventing etching of a covered portion of the mandrel region. Some aspects include a method, wherein the second vertical segment is connected to a second set of the first routes and separated from routes of the first set, the method further including: providing a mandrel region including first and second vertical portions overlapping the first and second vertical segments, respectively, and a plurality of first horizontal portions overlapping the mandrel recesses, each of the first horizontal portions extending a separation distance between the first and second vertical portions, abutting the first and second vertical portions, having a width equal to the identical width, and separated from another one of the first horizontal portions by the identical distance; providing a block mask including: a plurality of alternating third and fourth vertical portions on the first horizontal portions, the third and fourth vertical portions abutting the second and first vertical segments, respectively; and a plurality of second horizontal portions extending horizontally an entire distance separating the first and second vertical segments, each of the second horizontal portions separating one of the first horizontal segments from one of the third or fourth vertical portions; and etching, after providing the block mask, the block mask preventing etching of a covered portion of the mandrel region. Additional aspects include: providing the plurality of first routes and the first and second vertical segments in a first level of the substrate; and providing a plurality of third and fourth routes in a second level of the substrate, the third routes being connected to the first routes, and the fourth routes being separated from the first routes, wherein each route of the third and fourth routes extends in a direction perpendicular to each route of the first routes, or each route of the third and fourth routes extends in a direction parallel to each route of the first routes.

Another aspect of the present disclosure is a device including: a first net including a plurality of first routes, each of the first routes extending horizontally on one vertical position of a plurality of equally spaced vertical positions on a substrate; a second net including a plurality of second routes, each of the second routes extending horizontally on one of the vertical positions, the first and second nets being separated; and a plurality of third routes separated from the first and second nets, each of the third routes extending horizontally on one of the vertical positions and separating one of the first routes from one of the second routes.

Some aspects include: the first net further including a fourth route extending vertically on the substrate and abutting the first routes; and the second net further including a fifth route extending vertically on the substrate and abutting the second routes. Further aspects include the first, second, and third routes being positioned in an area between the fourth and fifth routes. Additional aspects include: the first, second, and third routes having an identical width, each of the first, second, and third routes being separated from an adjacent one of the first, second, and third routes by a distance equal to the identical width. Some aspects include a device, wherein the first, second, and third routes are in a first layer of the device, the device further including: a second layer adjacent to the first layer including a fourth route of the first net, a fifth route of the second net and a sixth route separated from the first and second nets, each of the fourth, fifth, and sixth routes having the identical width and being separated by the distance equal to the identical width. Further aspects include: the fourth, fifth, and sixth routes each extending in a direction parallel to the first, second, and third routes, each of the fourth routes overlapping one of the second routes or one of the third routes, each of the fifth routes overlapping one of the first routes or one of the third routes, and each of the sixth routes overlapping one of the first routes or one of the second routes. Additional aspects include the fourth, fifth, and sixth routes each extending in a direction perpendicular to the first, second, and third routes. Some aspects include the first and second routes being formed by a mandrel metal of a SADP technology and the third route being formed by a non-mandrel metal of the SADP technology.

Another aspect of the present disclosure is a method including: providing a plurality of first routes in a plurality of alternating mandrel and non-mandrel recesses extending horizontally in a first level of a substrate, each of the plurality of first routes having an identical width and being separated from an adjacent route of the plurality of first routes by the identical width; providing first and second vertical segments in the first layer connected to first and second sets of the plurality of first routes, respectively, and separated from routes of the second and first sets of routes, respectively, each route of the first set being separated from another route of the first set by one route of the second set; providing third and fourth sets of a plurality of second routes of alternating mandrel and non-mandrel recesses extending horizontally in a second level of the substrate, the third set being separated from the fourth set, wherein each route of the second routes extends in a direction perpendicular to each route of the first routes or each route of the second routes extends in a direction parallel to each route of the first routes; providing a first via connecting routes of the first and third sets; and providing a second via connecting routes of the second and fourth sets.

Some aspects include: providing routes of the first and second sets in the mandrel recesses and the non-mandrel recesses, respectively; providing a mandrel region partially surrounding the second vertical segment; and providing a block mask over the mandrel region, the block mask being separated from the second vertical segment. Further aspects include a method, wherein the plurality of first routes further includes a third set separated from the first and second vertical segments, each route of the first set being separated from a route of the second set by one route of the third set, the method further including: providing a mandrel region including first and second vertical portions overlapping the first and second vertical segments, respectively, and a plurality of horizontal portions, each of the horizontal portions overlapping one of the mandrel recesses, extending a separation distance between the first and second vertical segments, abutting the first and second vertical segments, having a width equal to the identical width, and being separated from another one of the horizontal portions by an identical distance; and providing a block mask including a plurality of alternating third and fourth vertical portions overlapping the horizontal portions, the third and fourth vertical portions being adjacent to the second and first vertical segments, respectively. Additional aspects include a method, wherein the identical distance is a multiple of the identical width, and routes of the third set are separated from routes of the first and second sets.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

As previously mentioned, many LELELE processes increase cost and manufacturing risk while reducing a yield of resulting devices, particularly for a 10 nm technology node and beyond. However, SADP technology may be utilized to provide BEoL VNCAPs for a 10 nm technology node and beyond without significantly increasing cost and manufacturing risk, and without reducing a yield of resulting devices. Specifically, the present disclosure addresses and solves the current problems of wide spaces between different capacitor plates, resulting in low overall capacitance and degraded performance, attendant upon integrating VNCAPs into ICs, particularly for a 10 nm technology node and beyond. In accordance with embodiments of the present disclosure, the problems are solved, for instance by, inter alia, providing a set of routes (e.g., patterns) in mandrel recesses connected to a first vertical segment (e.g., strap) and separated from a second vertical segment (e.g., strap).

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 2:
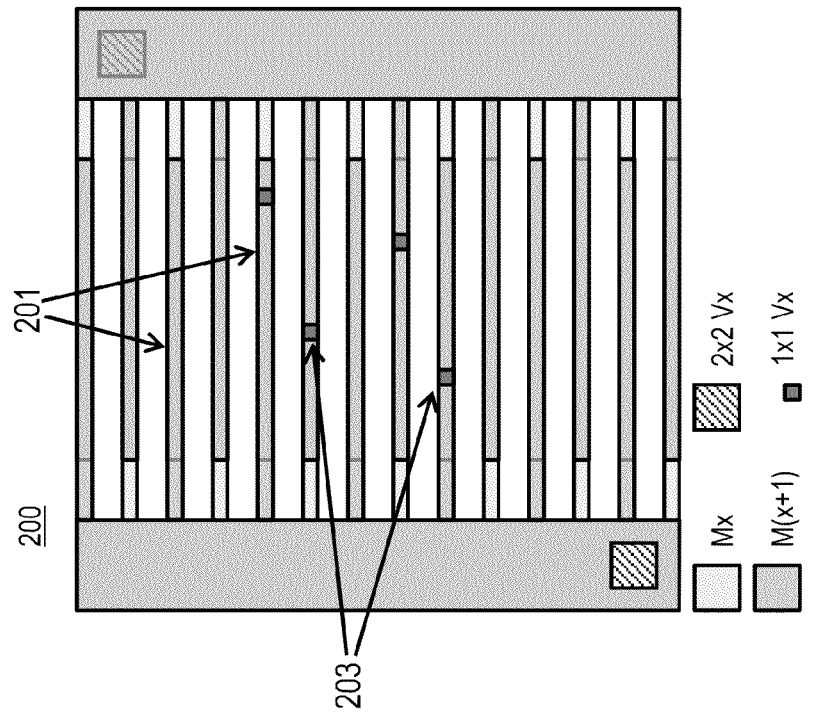
FIG. 2 illustrates a multi-level VNCAP with parallel adjacent metal level fingers, according to an exemplary embodiment.
Figure 1:
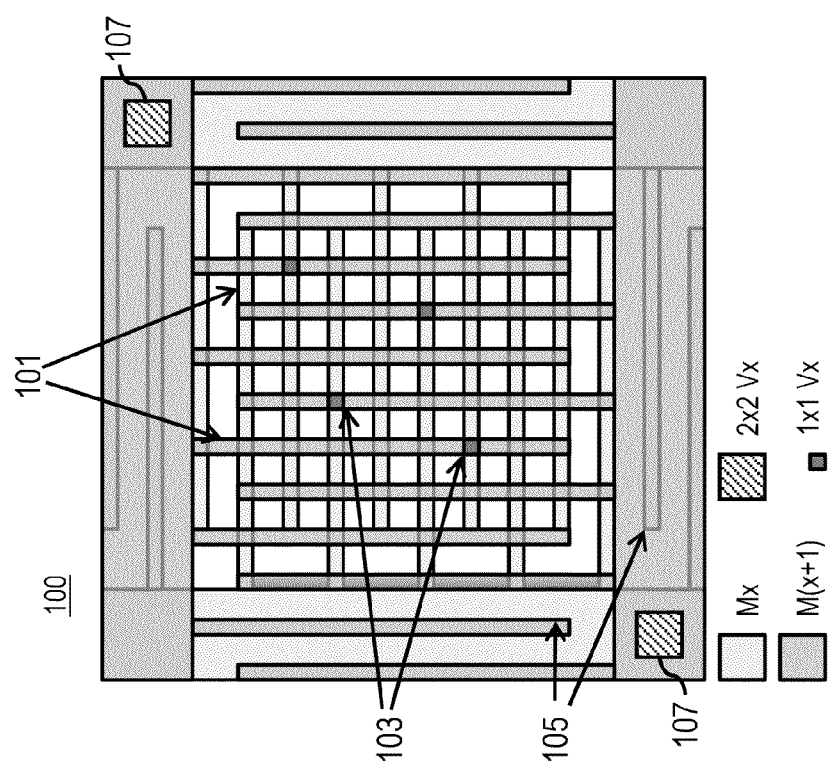
FIG. 1 illustrates a multi-level VNCAP with orthogonal adjacent metal level fingers, according to an exemplary embodiment.

FIG. 1 illustrates a multi-level VNCAP 100 with orthogonal adjacent metal level fingers, according to an exemplary embodiment. Adverting to FIG. 1, fingers 101 having a separation distance configured for a nominal voltage level are connected to nets by vias 103 and high voltage fingers 105 having a larger separation distance for a greater than nominal voltage level are connected to nets by large vias 107. It is noted that using some SADP processes, the large separation distance is a multiple (e.g., 3 times or 72 nm) of the smaller separation distance (e.g., 24 nm). Adverting to FIG. 2, fingers 201 of adjacent layers extend parallel to each other and are connected to nets through vias 203.

Figure 3:
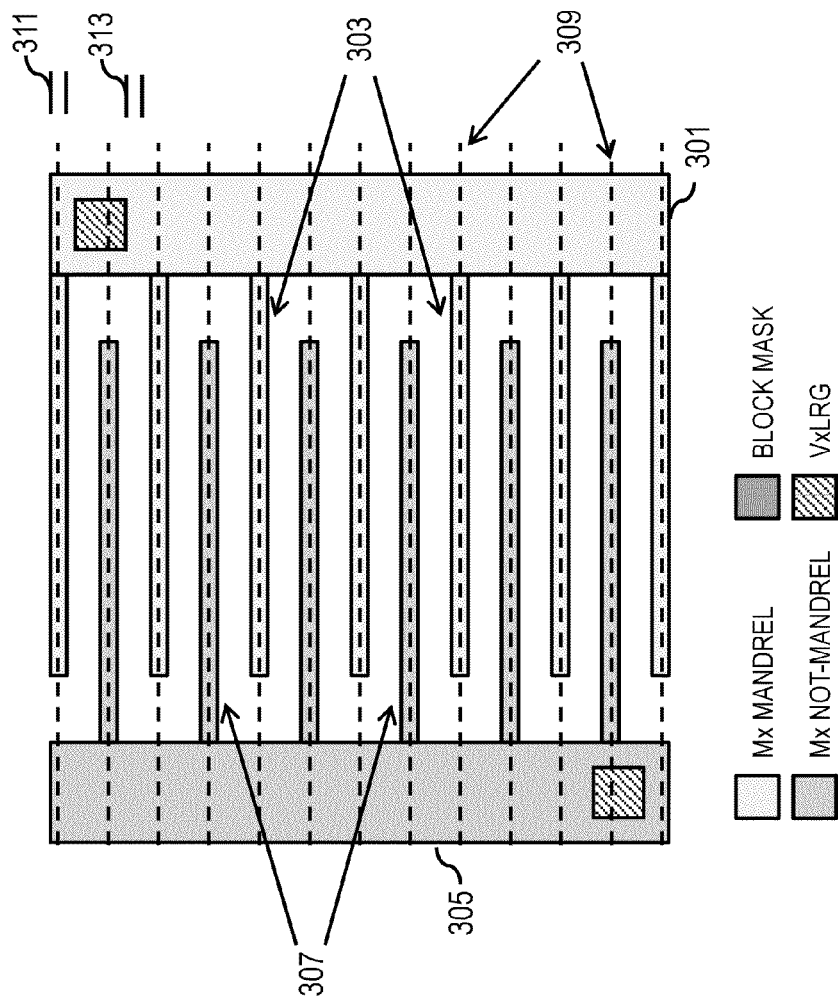
FIG. 3 illustrates a single layer of a VNCAP for a nominal operating voltage, according to an exemplary embodiment.

FIG. 3 illustrates a single layer 300 of a VNCAP for a nominal operating voltage, according to an exemplary embodiment. Adverting to FIG. 3, the layer 300 includes a first comb formed by a mandrel region having a vertical segment 301 (e.g., strap) and routes 303 (e.g., fingers) and a second comb formed by a non-mandrel region having a vertical segment 305 (e.g., strap) and routes 307 (e.g., fingers). As shown, each of the routes 303 and 307 is placed on one of equally spaced vertical positions 309 and has a width 311 (e.g., 24 nm) equal to a separation distance 313 between the routes 303 and 307. Furthermore, routes 303 and 307 of the first and second combs, respectively, are interdigitated and connected to other layers to create 3D negative and positive plates.

Figure 4:
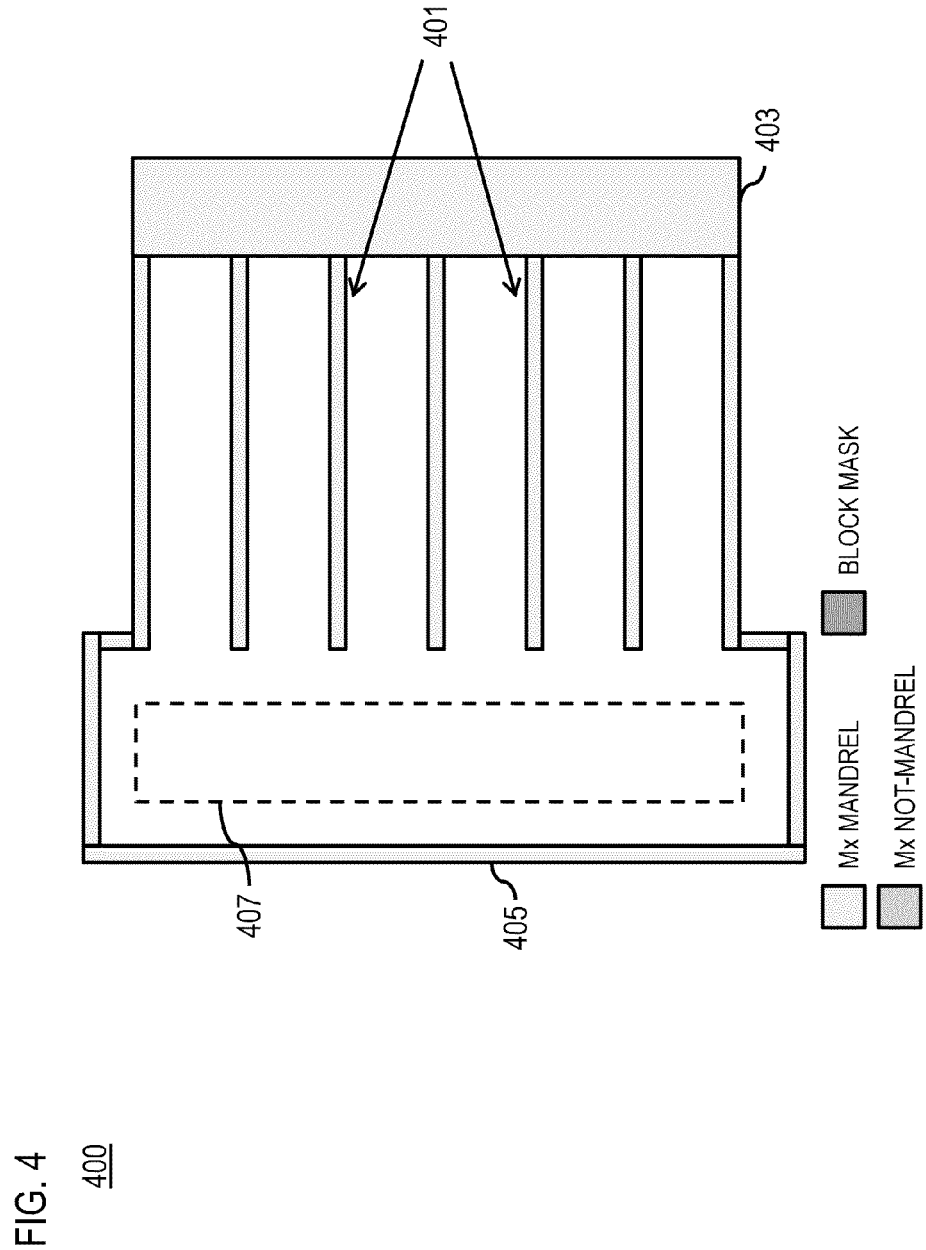
FIGS. 4 through 6 illustrate a method for providing a single layer of a VNCAP for a nominal operating voltage, according to exemplary embodiments.
Figure 5:
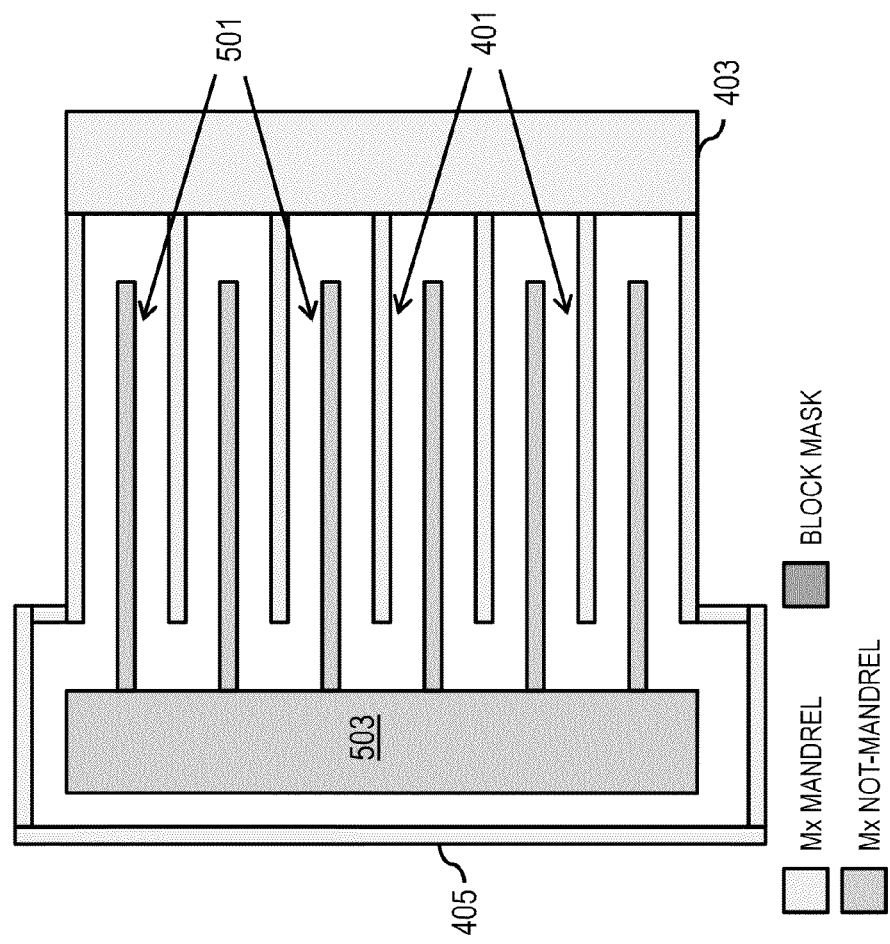
Figure 6:
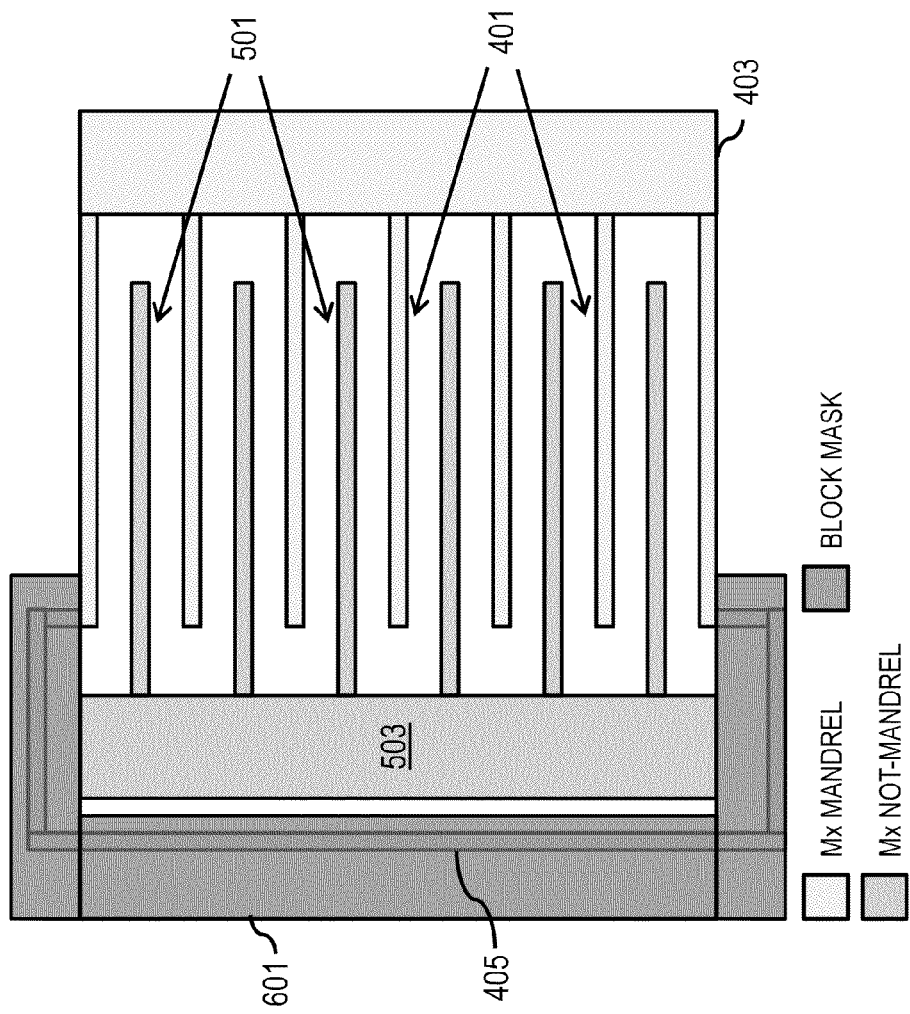

FIGS. 4 through 6 illustrate a method for providing a single layer of a VNCAP for a nominal operating voltage, according to exemplary embodiments. Adverting to FIG. 4, a mandrel region is provided on a substrate 400 to form horizontal portions 401, vertical portion 403, and a portion 405 to surround an intended vertical segment region 407. Next, in FIG. 5, a non-mandrel region having horizontal portions 501 and vertical segment 503 is provided using a traditional SADP process. For instance, spacers having a width equal to separation distance 313 are placed on sides of horizontal portions 401, vertical portion 403, and a portion 405 of the mandrel region, and the resulting non-mandrel region is provided as outside the separation distance 313 from the mandrel region. As shown, the SADP process results in the vertical segment 503 being provided in the intended vertical segment region 407.

Adverting to FIG. 6, a block mask 601 is provided over the portion 405 of the mandrel region to form the single layer 300. As shown, the block mask 601 is separated from (e.g., not overlapping) the horizontal portions 401 and vertical portion 403 of the mandrel region and the horizontal portions 501 and vertical segment 503 of the non-mandrel region. As such, the block mask 601 prevents an etching of portions of the substrate covered by the block mask 601, thereby preventing metal to be formed in mandrel (and non-mandrel) regions covered by the block mask 601. That is, spacers abutting the mandrel region (e.g., 401 and 403) and the block mask 601 prevent etching of covered portions, resulting in mandrel recesses being formed in the mandrel region (e.g., 401 and, 403) and non-mandrel recesses being formed in the non-mandrel region (e.g., 501 and 503). Additionally, a conductive material (e.g., metal) may be formed in the mandrel and non-mandrel recesses resulting in mandrel (e.g., 301 and 303) and non-mandrel routes (e.g., 305 and 307), respectively.

Figure 8:
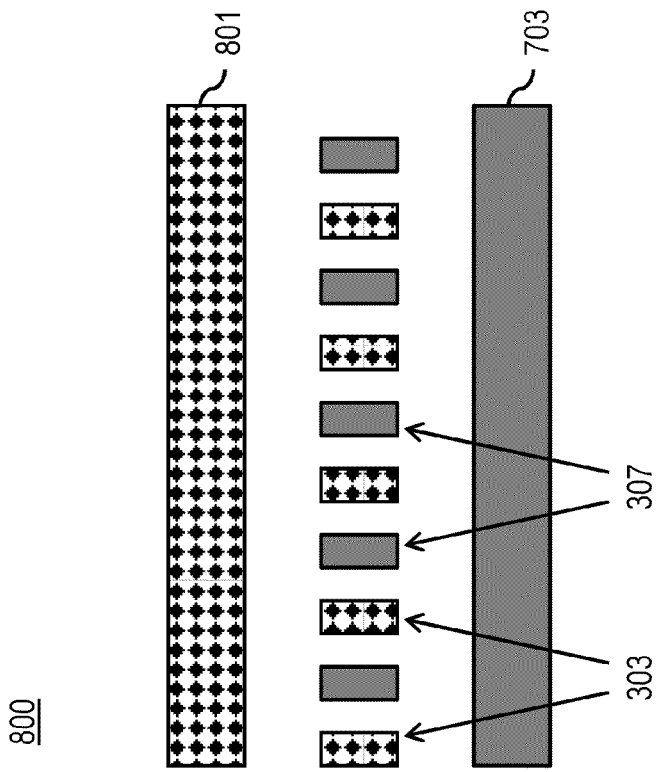
FIGS. 7 and 8 illustrate a multi-level VNCAP for a nominal operating voltage, according to an exemplary embodiment.
Figure 7:
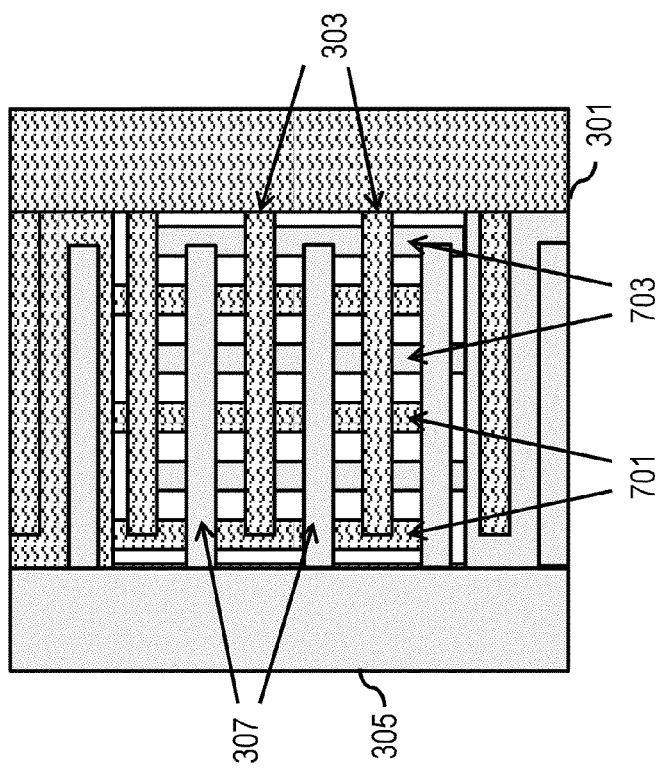

Adverting to FIG. 7, the single layer 300 is positioned on another layer or level having fingers 701 and 703 of the first and second nets, respectively. As shown, the fingers 701 and 703 are positioned to extend orthogonally to routes 303 and 307. Alternatively, the fingers 701 and 703 are positioned to extend parallel to routes 303 and 307. Adverting to FIG. 8, a cross-sectional view illustrates a VNCAP 800 having the routes 303 and 307 extending orthogonally to a finger 703 and to a finger 801 of another layer or level. As shown, routes 303 and finger 801 are (part of) the same net (e.g., first). Additional levels or layers may be added, for instance, a layer above the finger 801 and a layer below the finger 703 running parallel to the routes 303 and 307.

Figure 9:
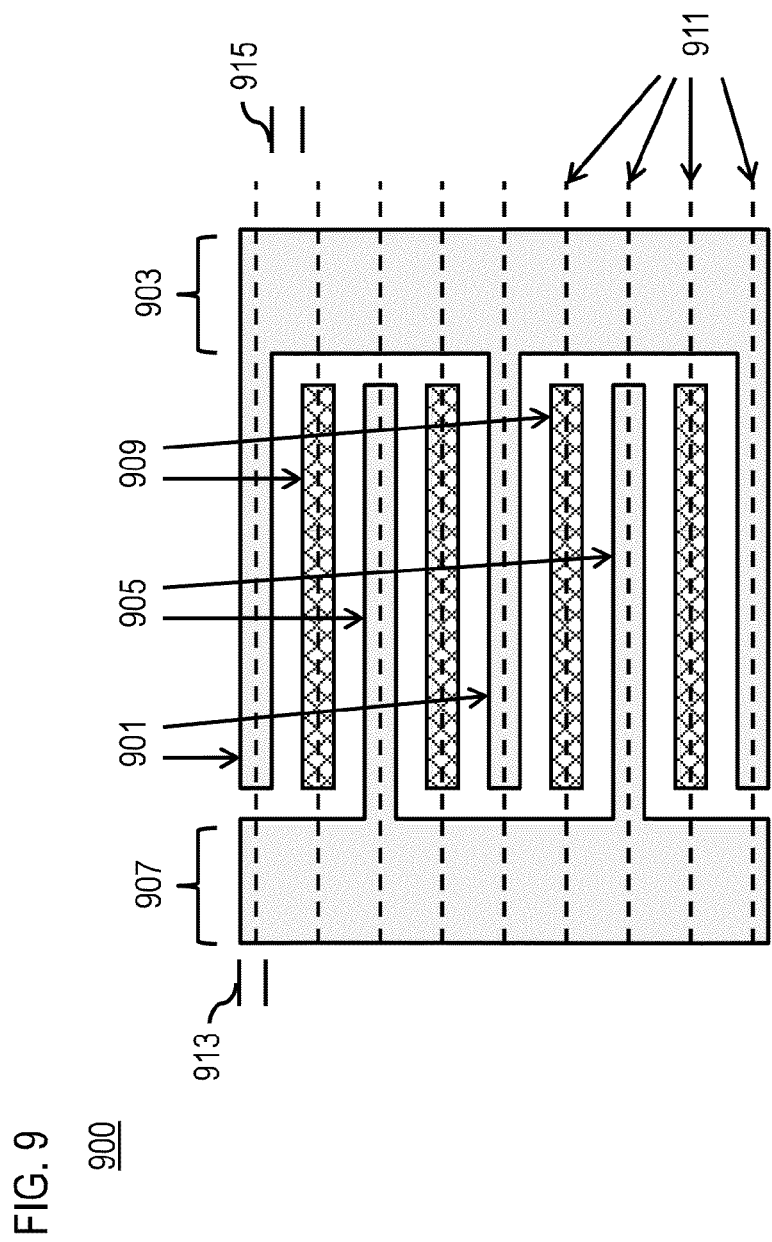
FIG. 9 illustrates a single layer of a VNCAP for an operating voltage greater than nominal, according to an exemplary embodiment.

FIG. 9 illustrates a single layer 900 for a VNCAP operating at a voltage greater than nominal, according to an exemplary embodiment. Adverting to FIG. 9, the layer 900 includes a first net having routes 901 and 903, a second net having routes 905 and 907, and routes 909 separated, for instance, by an electrical insulator from the first and second nets. As shown, the routes 901, 905, and 909 are each positioned on one of equally spaced vertical positions 911, have a width 913, and are separated from each other by a distance 915 equal to the width 913. Furthermore, the routes 909 are floating or island nodes and positioned between the first and second nets having routes 901 and 905 interdigitated, resulting in an improved capacitive density.

Figure 10:
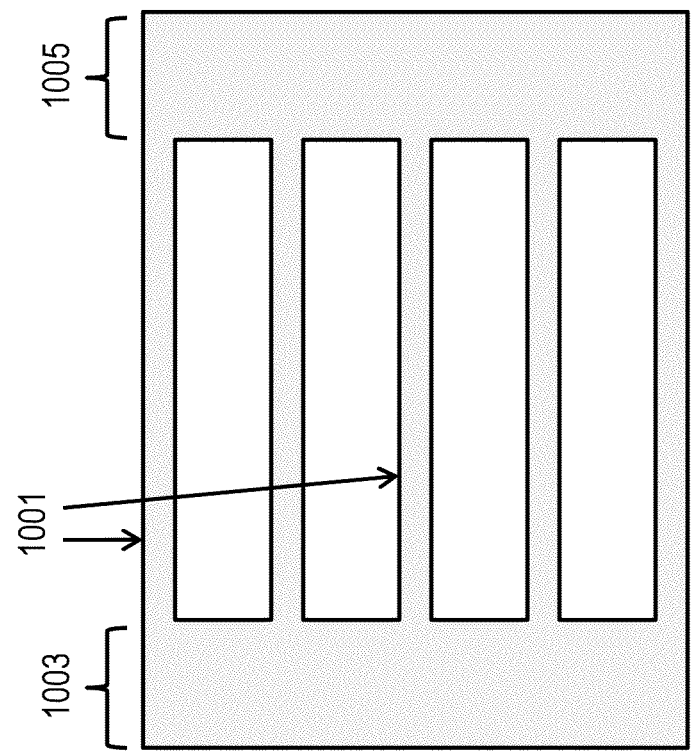
FIGS. 10 through 12 illustrate a method for providing a single layer of a first VNCAP for an operating voltage greater than nominal, according to an exemplary embodiment.
Figure 11:
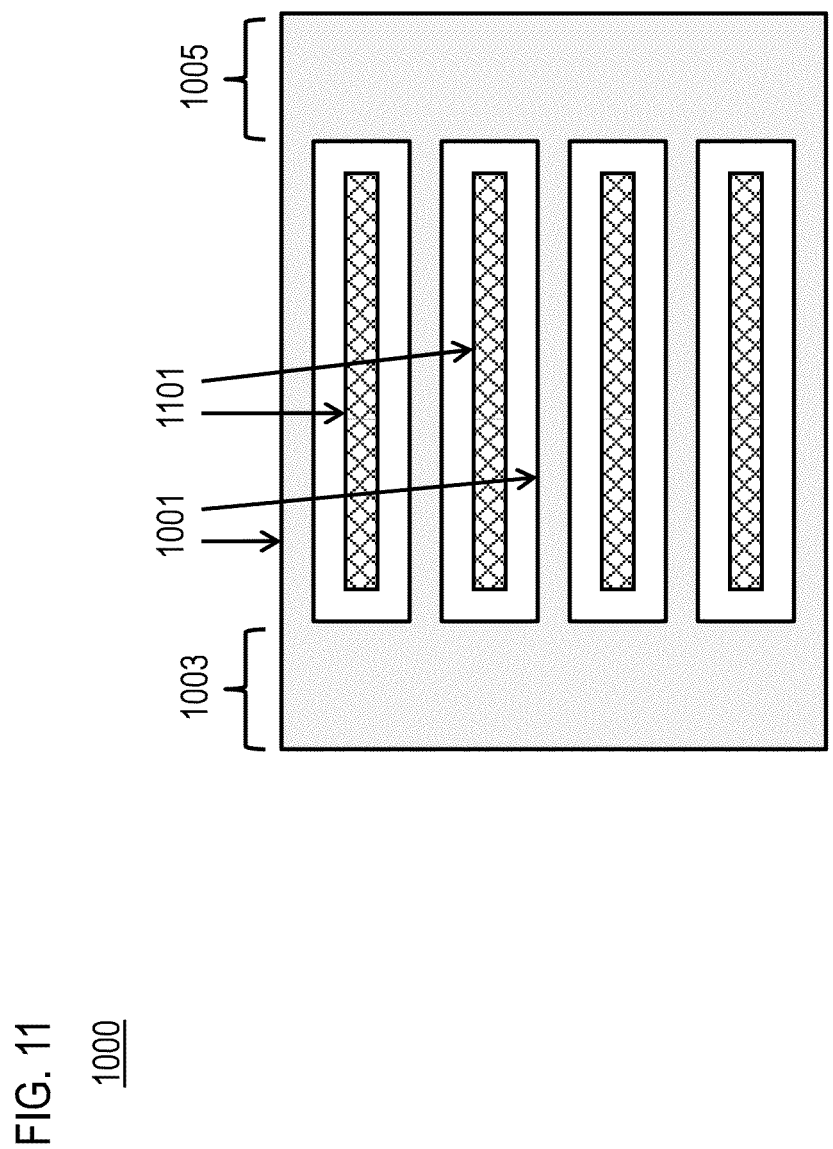
Figure 12:
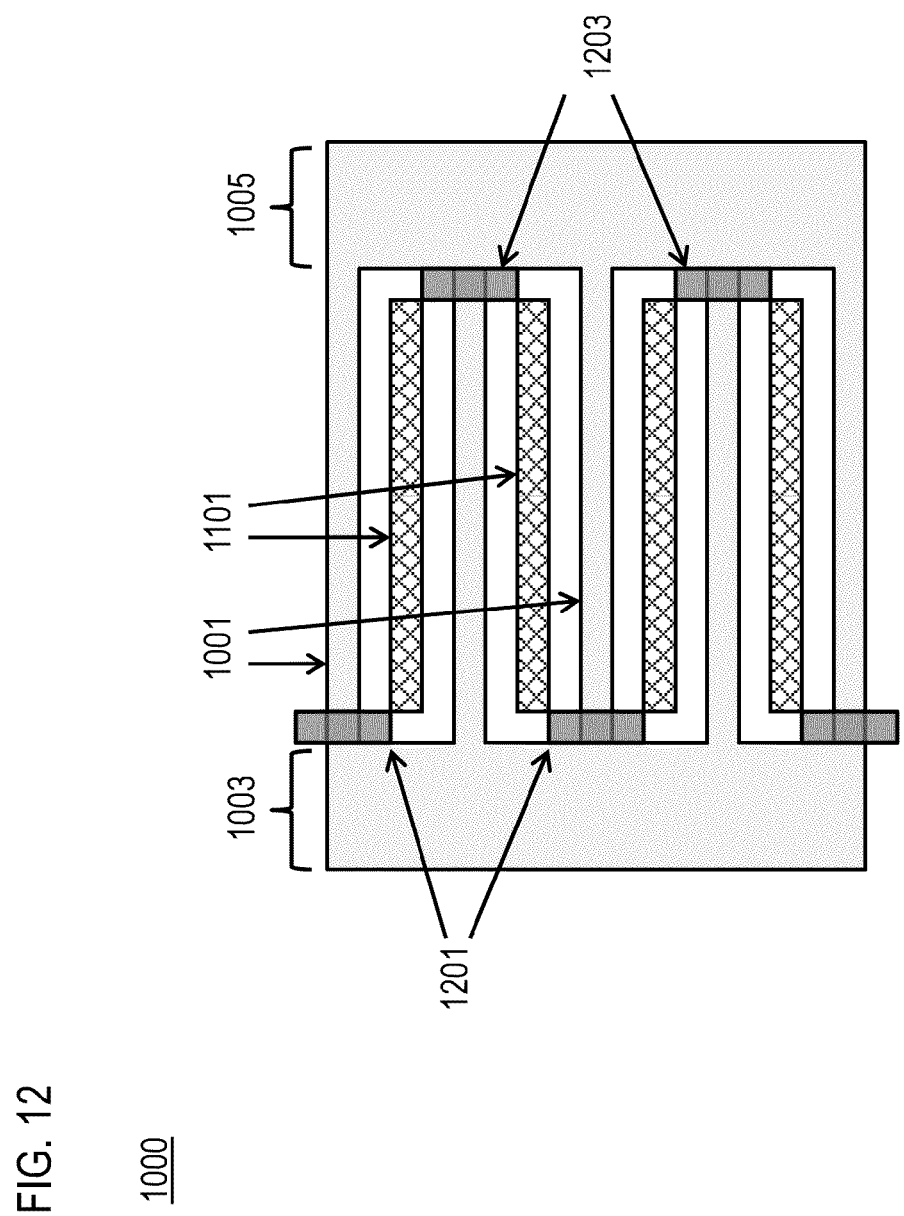

FIGS. 10 through 12 illustrate a method for providing a single layer of a VNCAP operating at a voltage greater than nominal, according to exemplary embodiments. Adverting to FIG. 10, a mandrel region is provided having horizontal portions 1001 and vertical portions 1003 and 1005. Next, in FIG. 11, a non-mandrel region having non-mandrel portions 1101 extending horizontally on substrate 1000 is provided as a result of using a traditional SADP process, for instance, as described above. Adverting to FIG. 12, a block mask having alternating first and second vertical segments 1201 and 1203, respectively, is provided on the horizontal portions 1001 to provide the single layer 900. As shown, the segments 1201 and 1203 are abutting (e.g., adjacent but not overlapping) the vertical portions 1003 and 1005 of the mandrel region. As such, the segments 1201 and 1203 prevent an etching of portions of the substrate 1000 covered by the segments 1201 and 1203, thereby preventing metal to be formed in mandrel regions (e.g., 1001) covered by the segments 1201 and 1203.

Figure 14:
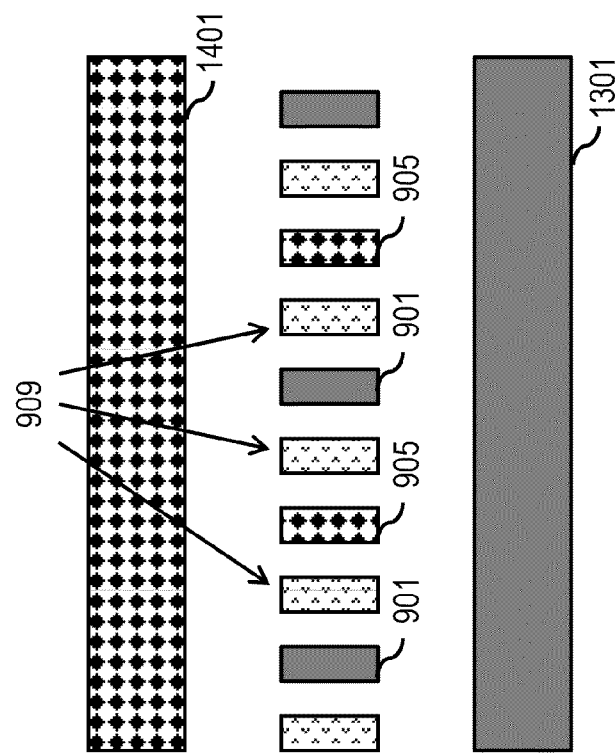
FIGS. 13 through 15 illustrate multi-level VNCAPs for an operating voltage greater than nominal, according to an exemplary embodiment.
Figure 13:
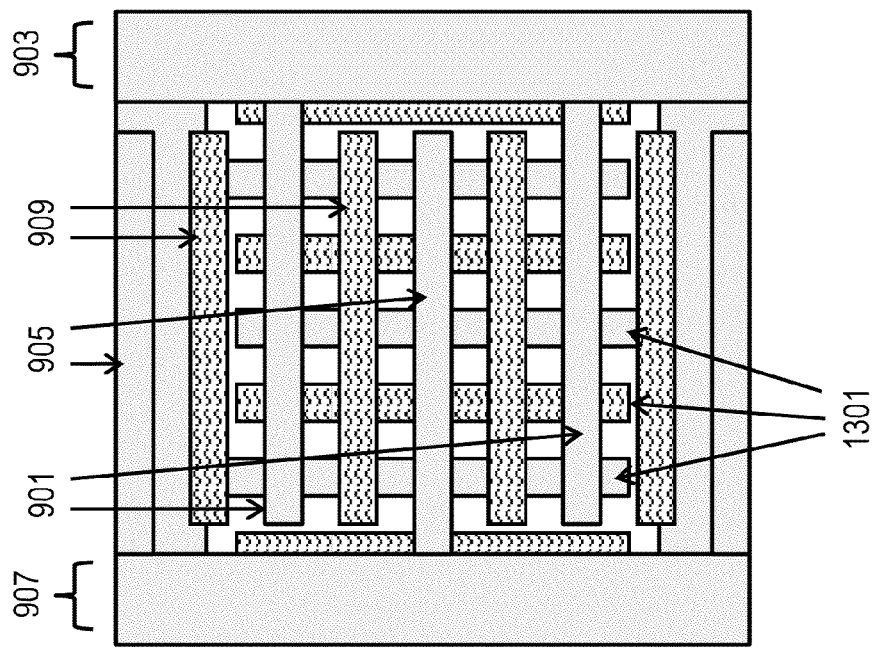
Figure 15:
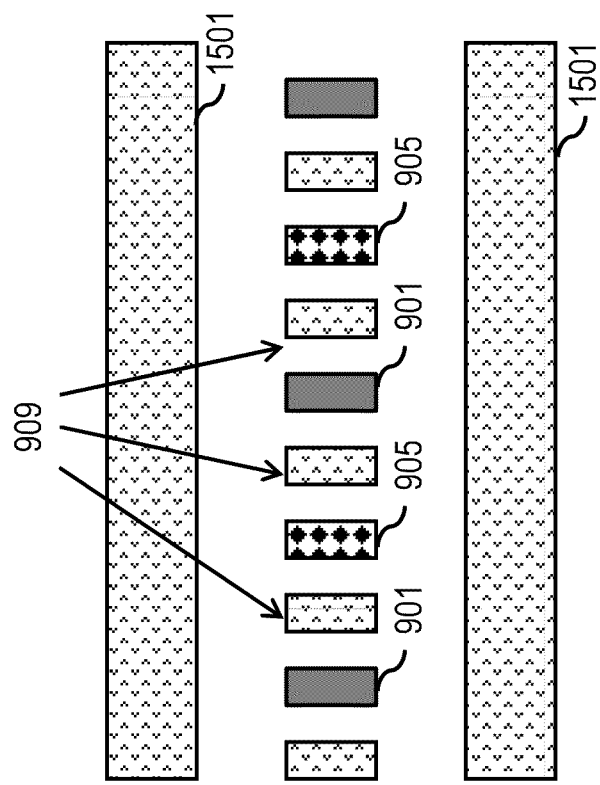

Adverting to FIG. 13, the single layer 900 is provided on another layer having fingers 1301 (e.g., routes 901, 905, and 909). As shown, the fingers 1301 are positioned to extend orthogonally to routes 901, 905, and 909. Alternatively, the fingers 1301 are positioned to extend parallel to routes 901, 905, and 909. Adverting to FIG. 14, a cross-sectional view illustrates a VNCAP 1400 having the routes 901, 905, and 909 extending orthogonally to a finger 1301 and to a finger 1401 of another layer. As shown, the finger 1301 and the routes 901 are of the first net and finger 1401 and routes 905 are of the second net. Additional levels or layers may be added, for instance, a layer above the finger 1401 and a layer below the finger 1301 running parallel to the routes 901, 905, and 909. Additionally or alternatively, the layer 900 of FIG. 9, can be between two floating fingers 1501 (e.g., routes 909) of adjacent layers as shown in FIG. 15.

Figure 16:
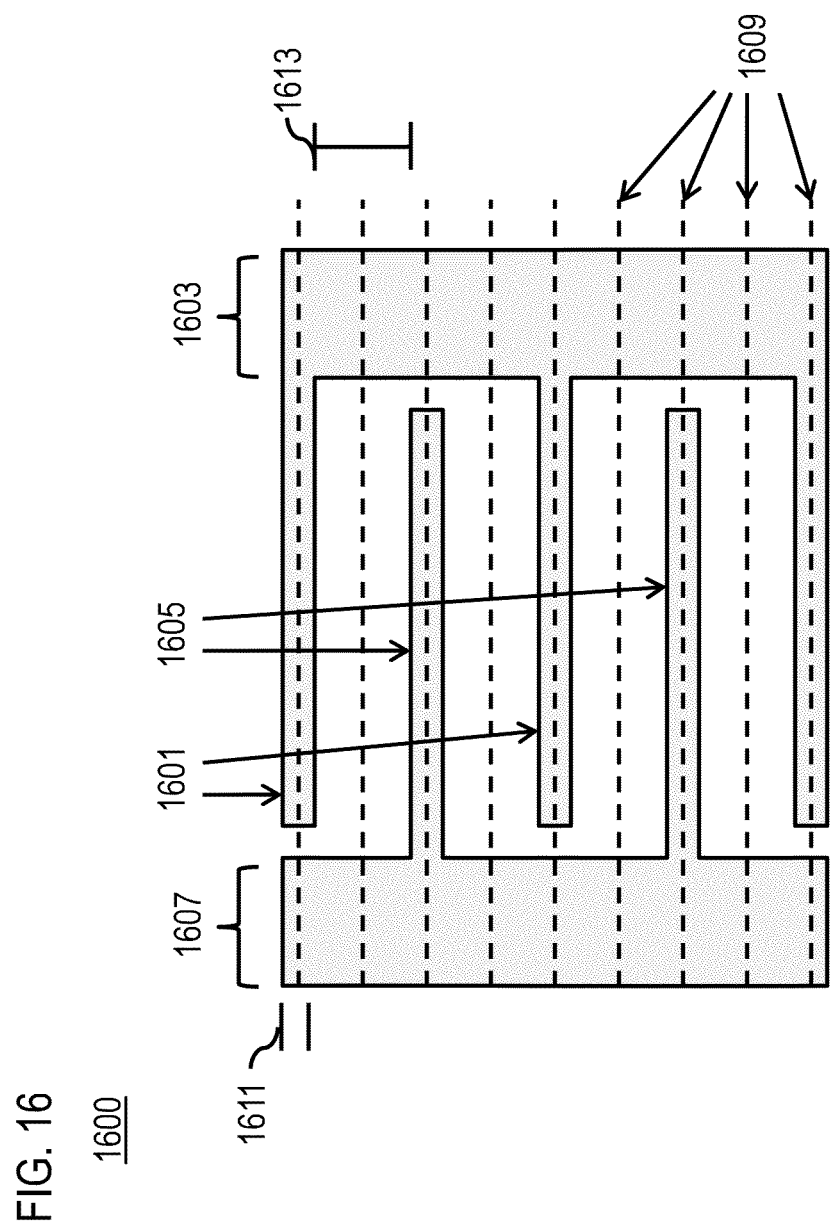
FIG. 16 illustrates a single layer of another VNCAP for an operating voltage greater than nominal, according to an exemplary embodiment.

FIG. 16 illustrates a single layer 1600 for another VNCAP operating at a voltage greater than nominal, according to an exemplary embodiment. Adverting to FIG. 16, the layer 1600 includes a first net having routes 1601 and 1603 and a second net having routes 1605 and 1607. As shown, the routes 1601 and 1605 are each positioned on one of equally spaced vertical positions 1609 have a width 1611 and are separated from each other by a distance 1613 equal to a multiple (e.g., 3) of the width 1611.

Figure 17:
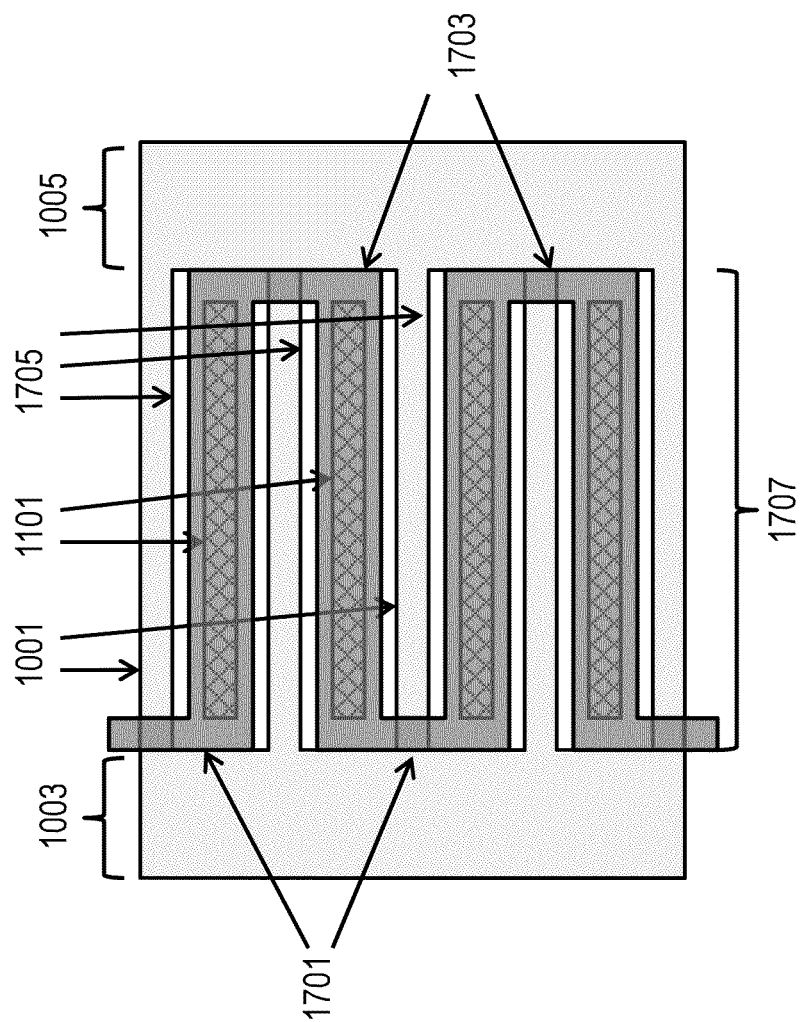
FIG. 17 illustrates another method for providing a single layer of a first VNCAP for an operating voltage greater than nominal, according to an exemplary embodiment.

FIG. 17 illustrates a method for providing another single layer of a VNCAP operating at a voltage greater than nominal, according to exemplary embodiments. Adverting to FIG. 17, the resulting mandrel and non-mandrel regions of FIG. 11 are provided on a substrate 1700 as described above to provide the layer 1600 of FIG. 16. Additionally, a block mask including alternating first and second vertical portions 1701 and 1703, respectively, is provided on the horizontal portions 1001 of the mandrel region. Furthermore, the block mask includes horizontal portions 1705 extending an entire distance 1707 separating the vertical portions 1003 and 1005. As such, the portions 1701, 1703, and 1705 prevent an etching of portions of the substrate 1700 covered by the portions 1701, 1703, and 1705, thereby preventing metal to be formed in mandrel regions (e.g., 1001) and non-mandrel regions (e.g., 1101) covered by the portions 1701, 1703, and 1705.

Figure 19:
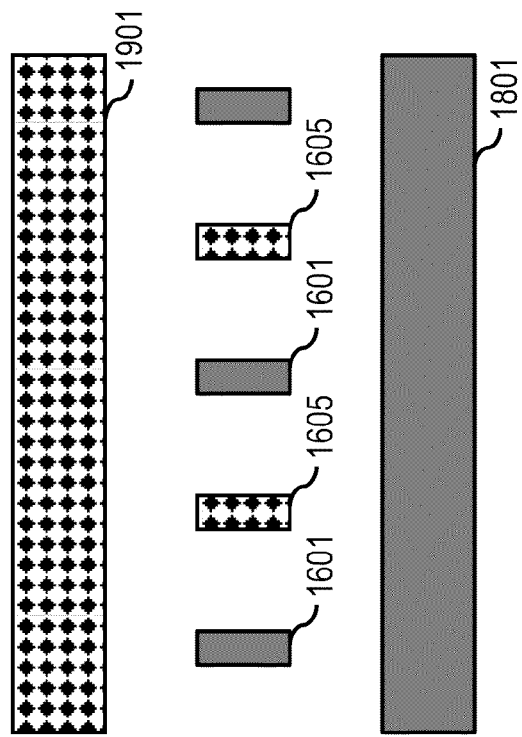
FIGS. 18 and 19 illustrate another multi-level VNCAP for an operating voltage greater than nominal, according to an exemplary embodiment.
Figure 18:
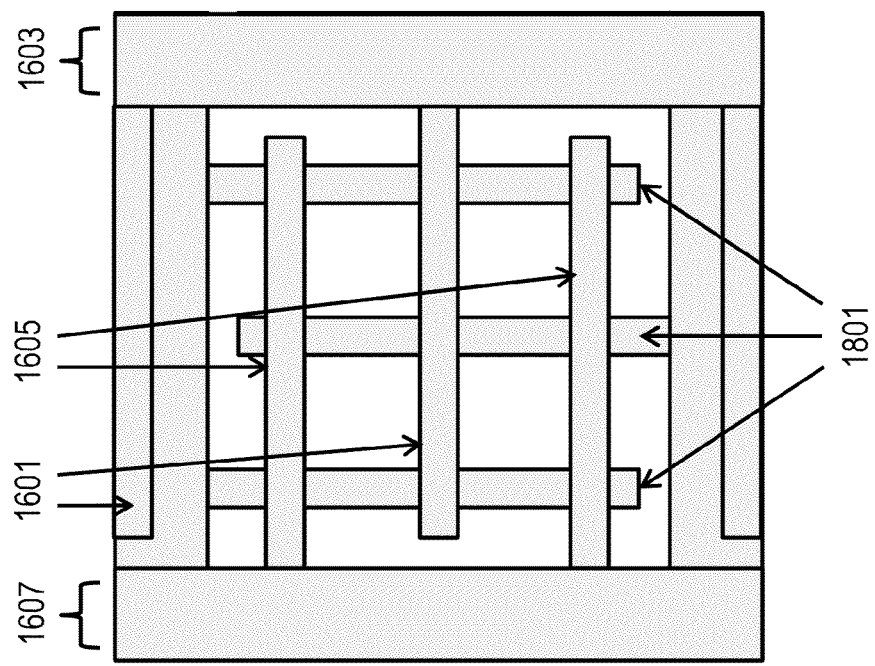

Adverting to FIG. 18, the single layer 1600 is provided on another layer having fingers 1801 (e.g., routes 1601 and 1605). As shown, the fingers 1801 are positioned to extend orthogonally to routes 1601 and 1605. Alternatively, the fingers 1801 are positioned to extend parallel to routes 1601 and 1605. Adverting to FIG. 19, a cross-sectional view illustrates a VNCAP 1900 having the routes 1601 and 1605 extending orthogonally to a finger 1801 and to a finger 1901 of another layer. As shown, the finger 1801 and the routes 1601 are of the first net and finger 1901 and routes 1605 are of the second net. Additional levels or layers may be added, for instance, a layer above the finger 1901 and a layer below the finger 1801 running parallel to the routes 1601 and 1605.

Simulation results indicated that the inclusion of routes 909, as illustrated in FIG. 9, which are electronically isolated (e.g., separated, floating, etc.) from nets of the BEoL VNCAP (e.g., routes 901 and 905) results in an improvement of 50% in capacitance density.

The embodiments of the present disclosure can achieve several technical effects, including an integration of capacitive components into ICs, resulting in ICs having a higher capacitive density and a lower cost. The present disclosure enjoys industrial applicability in any of various types of highly integrated semiconductor devices, particularly ICs having BEoL VNCAPs and utilizing SADP technology for a 10 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A computer-implemented method comprising:
   providing a plurality of mandrel recesses extending horizontally on a substrate, each of the mandrel recesses having an identical width and being separated from another one of the mandrel recesses by an identical distance;
   providing a plurality of first routes, each of the plurality of first routes being positioned in a different one of the mandrel recesses; and
   providing a first vertical segment and a second vertical segment on the substrate, the first vertical segment being connected to a first set of the plurality of first routes and separated from the second vertical segment, and the second vertical segment being separated from the first set of the plurality of first routes.

2. The method according to claim 1, the method further comprising:
   providing a plurality of second routes in a plurality of non-mandrel recesses extending horizontally on the substrate and separated from the first vertical segment, each of the non-mandrel recesses being positioned on a midpoint between two adjacent mandrel recesses of the mandrel recesses and having an identical width.

3. The method according to claim 2, the method further comprising:
   providing the plurality of second routes abutting the second vertical segment and separated from the first set of the plurality of first routes; and
   providing the second vertical segment in a non-mandrel region.

4. The method according to claim 3, the method further comprising:
   providing a mandrel region partially surrounding the second vertical segment;
   providing a block mask over the mandrel region, the block mask being separated from the second vertical segment; and
   etching, after providing the block mask, the block mask preventing etching of a covered portion of the mandrel region.

5. The method according to claim 2, further comprising:
   providing the second vertical segment in a mandrel region and abutting a second set of the first routes, each route of the second set being separated from a route of the first set by one route of the second routes; and
   providing the second routes separated from the second vertical segment.

6. The method according to claim 5, the method further comprising:
providing a mandrel region comprising a first vertical portion and a second vertical portion overlapping the first vertical segment and the second vertical segment, respectively, and a plurality of horizontal portions overlapping the mandrel recesses, each of the horizontal portions abutting the first and second vertical segments, having a width equal to the identical width, and being separated from another one of the horizontal portions by an identical distance;
providing a block mask including a plurality of alternating third and fourth vertical portions on the horizontal portions, the third and fourth vertical portions abutting the second and first vertical segments, respectively; and
etching, after providing the block mask, the block mask preventing etching of a covered portion of the mandrel region.

7. The method according to claim 1, wherein the second vertical segment is connected to a second set of the first routes and separated from routes of the first set, the method further comprising:
providing a mandrel region comprising a first vertical portion and a second vertical portion overlapping the first vertical segment and the second vertical segment, respectively, and a plurality of first horizontal portions overlapping the mandrel recesses, each of the first horizontal portions extending a separation distance between the first and second vertical portions, abutting the first and second vertical portions, having a width equal to an identical width, and separated from another one of the first horizontal portions by an identical distance;
providing a block mask including:
a plurality of alternating third and fourth vertical portions on the first horizontal portions, the third and fourth vertical portions abutting the second and first vertical segments, respectively; and
a plurality of second horizontal portions extending horizontally an entire distance separating the first and second vertical segments, each of the second horizontal portions separating one of the first horizontal segments from one of the third or fourth vertical portions; and
etching, after providing the block mask, the block mask preventing etching of a covered portion of the mandrel region.

8. The method according to claim 1, the method further comprising:
providing the plurality of first routes and the first and second vertical segments in a first level of the substrate; and
providing a plurality of third routes and a plurality of fourth routes in a second level of the substrate, the third routes being connected to the first routes, and the fourth routes being separated from the first routes, wherein each route of the third and fourth routes extends in a direction perpendicular to each route of the first routes, or each route of the third and fourth routes extends in a direction parallel to each route of the first routes.

9. A device comprising:
a first net comprising a plurality of first routes, each of the first routes extending horizontally on one vertical position of a plurality of equally spaced vertical positions on a substrate;
a second net comprising a plurality of second routes, each of the second routes extending horizontally on one of the vertical positions, the first and second nets being separated; and
a plurality of third routes separated from the first and second nets, each of the third routes extending horizontally on one of the vertical positions and separating one of the first routes from one of the second routes.

10. The device according to claim 9, further comprising:
the first net further comprising a fourth route extending vertically on the substrate and abutting the first routes; and
the second net further comprising a fifth route extending vertically on the substrate and abutting the second routes.

11. The device according to claim 10, further comprising:
the first, second, and third routes being positioned in an area between the fourth and fifth routes.

12. The device according to claim 9, further comprising:
the first, second, and third routes having an identical width, each of the first, second, and third routes being separated from an adjacent one of the first, second, and third routes by a distance equal to the identical width.

13. The device according to claim 12, wherein the first, second, and third routes are in a first layer of the device, the device further comprising:
a second layer adjacent to the first layer comprising a fourth route of the first net, a fifth route of the second net and a sixth route separated from the first and second nets, each of the fourth, fifth, and sixth routes having the identical width and being separated by a distance equal to the identical width.

14. The device according to claim 13, further comprising:
each of the fourth, fifth, and sixth routes extending in a direction parallel to the first, second, and third routes, the fourth route overlapping the second route or the third route, the fifth route overlapping the first route or the third route, and the sixth route overlapping the first route or the second route.

15. The device according to claim 13, further comprising:
each of the fourth, fifth, and sixth routes extending in a direction perpendicular to the first, second, and third routes.

16. The device according to claim 9, further comprising:
the first route and the second route being formed by a mandrel metal of a self-aligned-double-patterning (SADP) technology and the third route being formed by a non-mandrel metal of the SADP technology.

17. A computer-implemented method comprising:
providing a plurality of first routes in a plurality of alternating mandrel and non-mandrel recesses extending horizontally in a first level of a substrate, each of the plurality of first routes having an identical width and being separated from an adjacent route of the plurality of first routes by the identical width;
providing a first vertical segment and a second vertical segment in the first level connected to a first set of the plurality of first routes and a second set of the plurality of first routes, respectively, and separated from routes of the second set and routes of the first set, respectively, each route of the first set being separated from another route of the first set by one route of the second set;
providing a third set of a plurality of second routes and a fourth set of the plurality of second routes of alternating mandrel and non-mandrel recesses extending horizontally in a second level of the substrate, the third set being separated from the fourth set, wherein each route of the second routes extends in a direction perpendicular to each route of the first routes or each route of the second routes extends in a direction parallel to each route of the first routes;

providing a first via connecting routes of the first set and the third set; and providing a second via connecting routes of the second set and the fourth set.

18. The method according to claim 17, the method further comprising:

provide routes of the first set and the second set in the mandrel recesses and the non-mandrel recesses, respectively;

providing a mandrel region partially surrounding the second vertical segment; and providing a block mask over the mandrel region, the block mask being separated from the second vertical segment.

19. The method according to claim 17, wherein the plurality of first routes further comprises a third set separated from the first and second vertical segments, each route of the first set being separated from a route of the second set by one route of the third set, the method further comprising:

providing a mandrel region comprising a first vertical portion and a second vertical portion overlapping the first vertical segment and the second vertical segment, respectively, and a plurality of horizontal portions, each of the horizontal portions overlapping one of the mandrel recesses, extending a separation distance between the first and second vertical segments, abutting the first and second vertical segments, having a width equal to the identical width, and being separated from another one of the horizontal portions by an identical distance; and providing a block mask including a plurality of alternating third vertical portions and fourth vertical portions overlapping the horizontal portions, the third and fourth vertical portions being adjacent to the second and first vertical segments, respectively.

20. The method according to claim 19, wherein the identical distance is a multiple of the identical width and routes of the third set are separated from routes of the first and second sets.

* * * * *